US006628169B2

(12) United States Patent
Ivanov et al.

(10) Patent No.: US 6,628,169 B2
(45) Date of Patent: Sep. 30, 2003

(54) METHOD AND CIRCUIT FOR TRIMMING OFFSET AND TEMPERATURE DRIFT

(75) Inventors: Vadim V. Ivanov, Tucson, AZ (US); Junlin Zhou, Tucson, AZ (US); Wally Meinel, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/367,046

(22) Filed: Feb. 14, 2003

(65) Prior Publication Data

US 2003/0155975 A1 Aug. 21, 2003

Related U.S. Application Data

(63) Continuation-in-part of application No. 10/079,977, filed on Feb. 19, 2002.

(51) Int. Cl.[7] .............................. H03F 3/45; H03F 1/02; H03F 3/04; H03L 5/00; H01L 35/00
(52) U.S. Cl. ......................... 330/256; 330/9; 330/289; 327/307; 327/513
(58) Field of Search ............................. 330/2, 9, 289, 330/256; 327/513, 307

(56) References Cited

U.S. PATENT DOCUMENTS

| | | | | |
|---|---|---|---|---|
| 5,534,816 A | * | 7/1996 | Koglin et al. | 327/513 |
| 5,619,122 A | * | 4/1997 | Kearney et al. | 323/312 |
| 6,037,832 A | * | 3/2000 | Kaminishi | 327/538 |
| 6,215,353 B1 | * | 4/2001 | Lewyn | 327/538 |

* cited by examiner

Primary Examiner—Patricia Nguyen
(74) Attorney, Agent, or Firm—W. Daniel Swayze, Jr.; W. James Brady; Frederick J. Telecky, Jr.

(57) ABSTRACT

An exemplary trimming circuit can be further simplified to include a single current source to provide for trimming of offset and temperature drift in a device, such as an op amp, voltage reference and the like. A single temperature-dependent current source is trimmed to a predetermined value, for example to zero, at a first temperature, and then the current from the temperature-dependent current source is used to trim output parameters, i.e., adjust the output variables, to a desired value at a second temperature. An exemplary trimming circuit comprises a temperature-dependent current source $I_{(T)}$, a current switch and a device to be, trimmed. The current switch is configured to suitably facilitate the trimming of the trimmed device through coupling of a fraction or multiple of the current signal from temperature-dependent current source $I_{(T)}$ to one or more offset-control terminals of the trimmed device.

20 Claims, 10 Drawing Sheets

METHOD AND CIRCUIT FOR TRIMMING OFFSET AND TEMPERATURE DRIFT

CROSS-REFERENCE TO RELATED APPLICATION

This application is a continuation-in-part of pending U.S. application Ser. No. 10/079,977, entitled "Method and Circuit for Trimming Offset and Temperature Drift for Operational Amplifiers and Voltage References", filed Feb. 19, 2002, and hereby incorporated herein by reference.

FIELD OF INVENTION

The present invention relates to the trimming of a device for use in microcontroller-based products. More particularly, the present invention relates to a method and circuit for effectively trimming offset and temperature drift in various devices, such as operational amplifiers, instrumentation amplifiers ("IA's"), digital-to-analog converters ("DAC's"), and voltage references and the like.

BACKGROUND OF THE INVENTION

The demand for higher performance, microcontroller-based products for use in communication and processing applications continues to increase rapidly. As a result, microcontroller and electronics based product manufacturers are requiring for the components and devices within these products to be continually improved to meet the design requirements of a myriad of emerging audio, video, imaging and wireless applications. These microcontroller-based products comprise devices such as, for example, operational amplifiers ("op amps"), instrumentation amplifiers ("IA's"), digital-to-analog converters ("DAC's"), and voltage references and the like. Op amps and IA's provide, for example, signal amplification and high impedance signal transfer. Voltage references provide substantially constant output voltages despite gradual or momentary changes in input voltage, output current or temperature.

Op amps, IA's, DAC's, and voltage references and other similar types of devices typically are trimmed during or after manufacture to improve the precision and accuracy of the devices. For example, the trimming of differential input stages of an op amp can be performed such that equal input signals applied to both input terminals of the op amp generates equal output signals at both outputs of the op amp. Microcontroller-based products incorporating circuits which benefit from trimming techniques include various digital devices, such as clock radios, microwave ovens, digital video recorders and the like.

Some of the main objectives for trimming techniques include the correction of offset and temperature drift in the devices. Offset and temperature drift can arise due to manufacturing variation, inherent temperature mismatches at the manufacturing level, and packaging stresses. Utilizing trimming techniques in correcting for these offsets and temperature drifts improves the accuracy and reliability of the circuit. For example, in bipolar op amps, the input stage offset is directly correlated with temperature drift. Therefore, offset trimming performed at normal temperatures can improve the temperature drift parameter as well. However, bipolar reference devices do not have such features and therefore, simultaneous output voltage and drift trim is not possible using this same technique on bipolar reference devices.

In field effect transistor ("FET") op amps, the input stage offset can be correlated to the temperature drift by measuring the offset at two different temperatures and calculating the amount of trimming needed. This trimming calculation method, however, is complex because the trimming procedure is unique to the individual part, and thus part identification is needed during both measuring and trimming of the offset. For this reason, this trimming method is not suitable for in-package trimming during final testing of the op amp. In CMOS op amps, no correlation exists between offset and temperature drift. Furthermore, relatively large offset/temperature drift shifts can result after packaging a CMOS circuit. Therefore, it is impractical to perform trimming at the wafer-level, ie., performed before packaging.

Accordingly, a need exists for an improved method and circuit for trimming devices to effectively address both offset and temperature drift problems.

SUMMARY OF THE INVENTION

In accordance with one aspect of the present invention, a trimming circuit is provided for offset trimming for at least two different temperatures, wherein the offset trimming can effectively decrease both offset and temperature drift in devices such as op amps and voltage references. In accordance with another aspect of the present invention, changing the temperature dependencies of current sources facilitates the trimming processes. In accordance with an exemplary embodiment of the present invention, the trimming circuit is configured with a current source stage configured to trim the output of device, such as an op amp or voltage reference stage, by changing the temperature dependencies of various current sources within the current source stage.

In accordance with an exemplary embodiment of the present invention, the trimming circuit comprises at least two current sources configured such that one current source has a positive temperature coefficient and another current source has a negative temperature coefficient. In accordance with this embodiment, the two current sources are configured to be interchangeable with other current sources to facilitate changing of the temperature coefficient of one of the two current sources. In accordance with this embodiment, the two current sources are also configured to be selectively connected to the input stage offset-control terminal or terminals of the op amp, voltage reference or other device.

In accordance with another exemplary embodiment of the present invention, the trimming circuit is configured with one or more combination current sources comprising at least two parallel current sources. In accordance with this exemplary embodiment of the present invention, the one or more combination current sources are configured to selectively connect to, or disconnect from, either of the offset-control terminals of the device, e.g., a differential input stage of an op amp, to facilitate trimming. In accordance with an exemplary embodiment, at least one of the two current sources within a combination current source is configured to be interchangeable with other current sources to facilitate the changing of the temperature coefficient of that current source and to thus facilitate offset and temperature drift trimming.

In accordance with another aspect of the present invention, a method of trimming is provided for offset trimming a device, such as an op amp or voltage reference, on at least two different temperatures wherein the trimming method effectively decreases offset as well as temperature drift. In accordance with an exemplary embodiment of the present invention, the trimming method comprises an exemplary first step, executed at a first temperature, of trimming first and second current sources, having first and second temperature dependencies, to balance the currents of the first and second current sources. During a second exemplary step, and at the first temperature, the output of a device, e.g., a differential input stage of an op amp, is trimmed. In accordance with an exemplary embodiment of the present invention, the step of offset trimming can be performed at the first temperature by switching combination current sources from one output of the differential input stage to another output of the differential input stage. In another exemplary embodiment of the present invention, the offset trimming can be performed by adding or removing combination current sources from an output of the differential input stage. Upon trimming the differential input stage, the trimming method further employs a third step of offset trimming at a second temperature. In accordance with an exemplary embodiment, the step of offset trimming at a second temperature can be performed by changing the temperature dependency of at least one current source within one or more combination current sources. In accordance with an exemplary embodiment of the present invention, the temperature dependency change is facilitated by replacing a first current source with a different current source having the same temperature coefficient as the second current source.

In a further exemplary embodiment, individual first and second current sources, having first and second temperature coefficients respectively, are configured such that at least some of the first and second current sources may be individually connected to, or disconnected from, an output of the differential input stage, while some of the first and second current sources may be switched from one output of the differential input stage to another. In an exemplary first step, and at a first temperature, the current sources are trimmed for equal current between first and second current sources. In an exemplary second step, and at the first temperature, first current sources are added and removed from the outputs of the differential input stage to provide offset trimming. In an exemplary third step, and at a second temperature, some first current sources having a first temperature coefficient are replaced with other current sources a temperature coefficient similar to the second current sources for facilitating offset trimming the output terminals.

In accordance with another aspect, of the present invention, an exemplary trimming circuit can be further simplified to include a single current source to provide for trimming of. offset and temperature drift in a device, such as an op amp, voltage reference and the like. In accordance with this aspect of the present invention, a temperature-dependent current source is trimmed to a predetermined value at a first temperature, for example, to approximately zero, and then the current from the temperature-dependent current source is used to trim output parameters, i.e., adjust the output variables, to a desired value at a second temperature. In accordance with an exemplary embodiment, an exemplary trimming circuit comprises a temperature-dependent current source $I_{(T)}$, a current switch and a device to be trimmed, such as an op amp, voltage reference and the like. The temperature-dependent current source $I_{(T)}$ is suitably coupled to trimmed device through current switch. The current switch is configured to suitably facilitate the trimming of the trimmed device through coupling of a fraction or multiple of the current signal from temperature-dependent current source $I_{(T)}$ to one or more offset-control terminals of the trimmed device.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, e.g., buffers, voltage and current references, memory components and the like, comprised of various electrical devices, e.g., resistors, transistors, capacitors, diodes or other devices, whose values may be suitably configured for various intended purposes. In addition, the exemplary methods and circuits may be practiced in any microcontroller or electronics based application, such as instrumentation amplifiers, voltage references, DAC's and other like devices. However for purposes of illustration only, exemplary embodiments of the present invention are described herein in connection with the trimming of a differential input stage of a CMOS op amp.

Further, it should be noted that while various components may be suitably coupled or connected to other components within exemplary circuits, such connections and couplings can be realized by direct connection between components, or by connection through other components and devices located therebetween. To understand the various operational sequences of the present invention, an exemplary description is provided. However, it should be understood that the following example is for illustration purposes only and that the present invention is not limited to the embodiments disclosed.

As discussed above, prior art trimming techniques are not capable of decreasing the negative effects of offset and temperature drift commensurate with the performance required of currently developing op amps and voltage reference devices. Therefore, it is desirable to provide an offset trimming circuit and method that can achieve both offset trimming and reduce temperature drift in the op amps and voltage reference devices. Furthermore, it is desirable to perform offset trimming after packaging of the op amps and voltage reference devices.

That being said, in accordance with various aspects of the present invention, a method and trimming circuit are configured for providing trimming on at least two different temperatures to effectively decrease both offset and temperature drift in devices, such as op amps, instrumentation amplifiers, DAC's and voltage reference devices and the like. In accordance with one aspect of the present invention, the trimming process can be facilitated through the changing of the temperature dependencies of current sources within the trimming circuit. In accordance with an exemplary embodiment of the present invention, the trimming circuit is configured with a current source stage configured to trim the output of an op amp or voltage reference stage.

Figure 1:
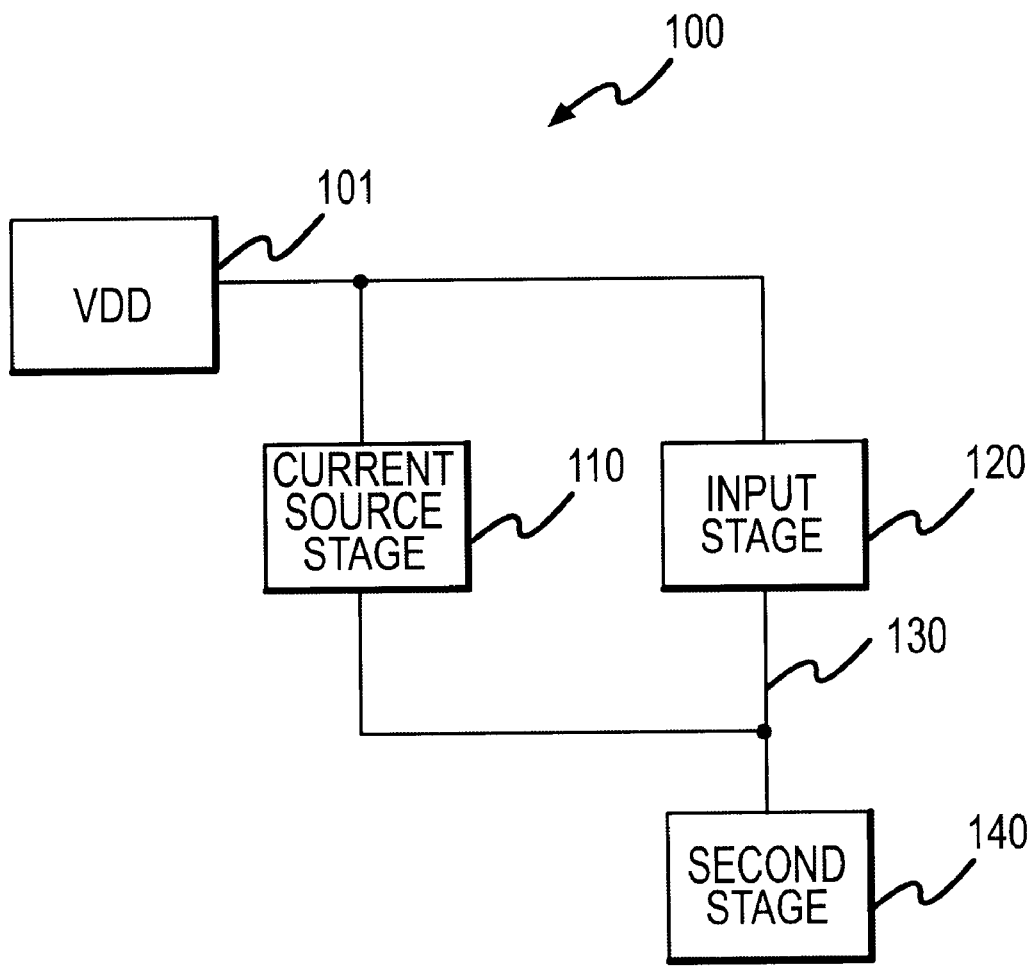
FIGS. 1–5 illustrate block diagrams of exemplary trimming circuits in accordance with exemplary embodiments of the present invention.

With reference now to FIG. 1, an exemplary trimming circuit 100 comprises an op amp or reference voltage input stage 120 and a current source stage 110 configured to trim the offset-control terminal or voltage-control terminal 130. Power to trimming circuit 100 can be provided from a power source 101, which can comprise various power supply sources, such as a $V_{DD}$ supply. Op amp input stage 120 can comprise various components and devices in which trimming may be desired, such as a differential input transistor stage. Alternatively, op amp stage 120 could be suitably replaced with a voltage reference stage in which trimming is desired. In accordance with an exemplary embodiment, op amp input stage 120 generates an output signal at output 130 of input stage 120. Output 130 can be suitably coupled to a second stage 140. Second stage 140 may comprise various types of devices such as a follower stage, an output stage, or the like. Furthermore, second stage 140 may comprise N stages where N is greater than 1. Second stage 140 may further include a load connected to ground. In this exemplary embodiment, current source stage 110 can comprise various current source devices which can be configured to facilitate trimming on at least two different temperatures. The trimming may, be facilitated by changing the temperature dependencies of the various current sources within the trimming circuit and by selectively connecting the various current sources to the output.

In accordance with one exemplary embodiment of the present invention, current source stage 110 is configured with at least two current sources configured such that one current source has a positive temperature coefficient and another current source has a negative temperature coefficient. In accordance with this embodiment, the two current sources are configured to be interchangeable with other current sources to facilitate changing of the temperature coefficient of one of the two current sources. In accordance with this embodiment, the two current sources are also configured to be selectively connected to the op amp or voltage reference stage output.

Figure 2:
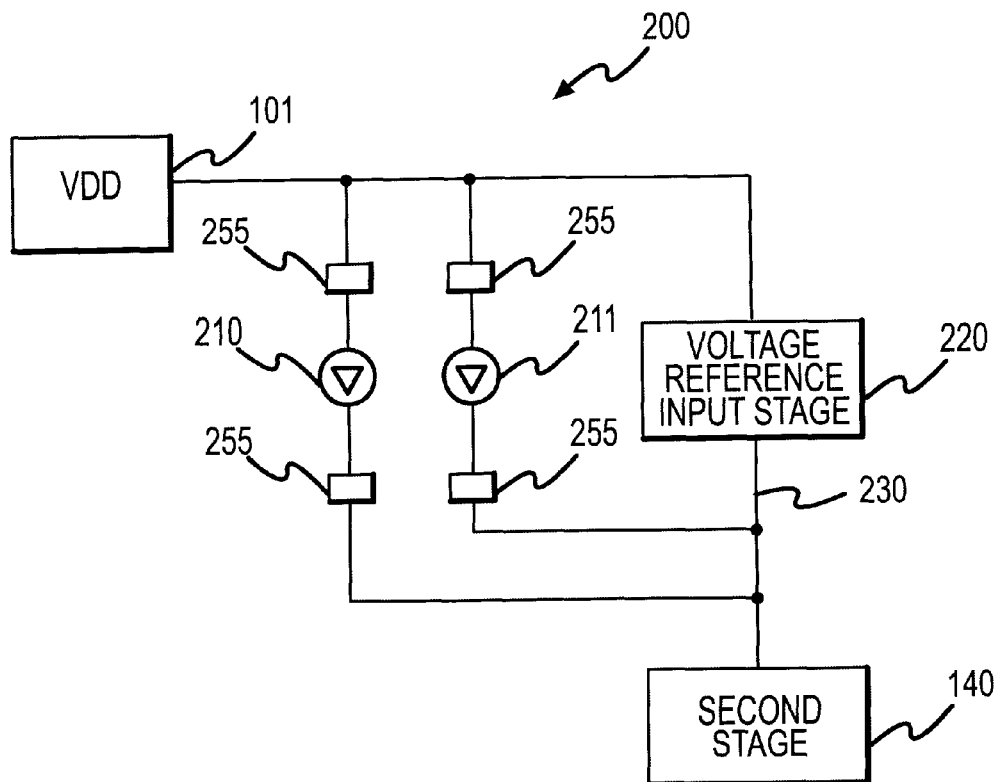

With reference now to FIG. 2, an exemplary trimming circuit 200 comprises a current source stage 110 and a voltage reference input stage 220. In accordance with the exemplary embodiment, voltage reference stage 220 comprises a voltage-control terminal 230 suitably coupled to a second stage 140. Current source stage 110 comprises a plurality of current sources, for example, two current sources 210 and 211 Current sources 210 and 211 are suitably coupled to control terminal 230 to facilitate trimming the voltage reference output. For example, current sources 210 and 211 are configured such that current source 210 has a positive temperature coefficient and current source 211 has a negative temperature coefficient. The two current sources 210 and 211 are configured to be selectively interchangeable with other current sources, not shown, to facilitate changing of the temperature coefficient of one of the two current sources.

Furthermore, current sources 210 and 211 are configured to be selectively connected to voltage-control terminal 230 such that the current from current sources 210 and 211 can be selectively added or removed from the total current delivered to second stage 140 to facilitate trimming of voltage reference 220. For example, one or more switches 255 can enable current source 210 or 211 to be selectively added or removed from trimming circuit 200.

Figure 3:
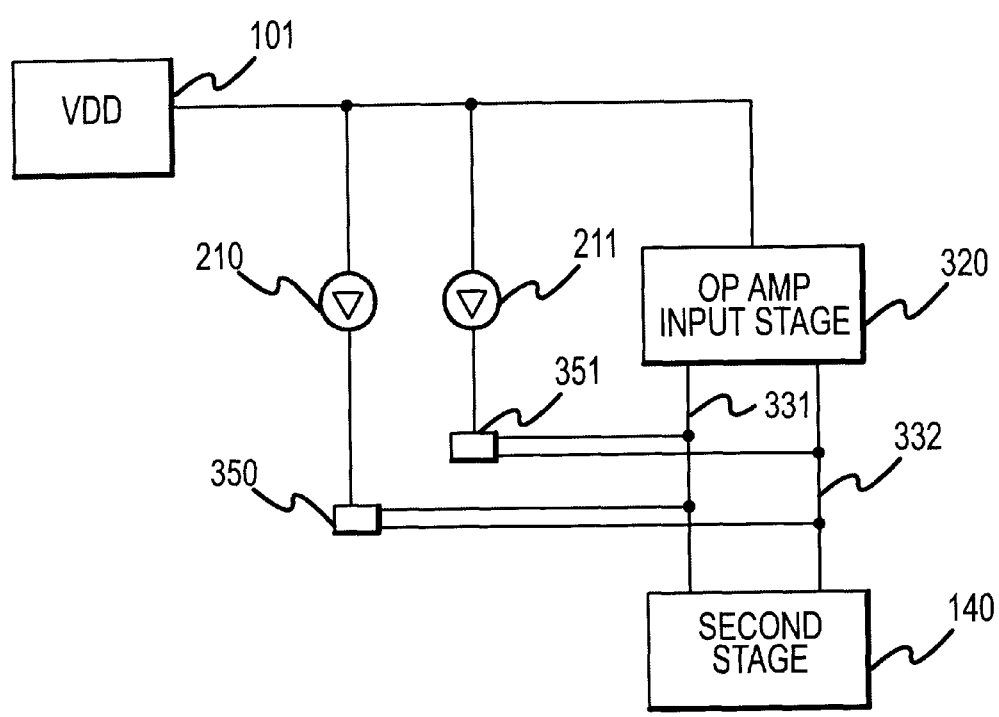

With reference now to FIG. 3, in another exemplary embodiment of the present invention, where similar references are similarly labeled as in previous figures, an op amp input stage 320 replaces the voltage reference input stage 220. Op amp input stage 320 may, for example, have a first output terminal or a first offset-control terminal 331 and a second output terminal or second offset-control terminal 332. In this exemplary embodiment of the present invention, trimming circuit 300 comprises a current source stage 110 configured with switches 350 and 351 such that current from current sources 210 and 211 can be selectively switched from first offset-control terminal 331 to second offset-control terminal 332 to trim offset and temperature drift. It is noted that switches 350 and 351 may also facilitate adding and removing current sources 210 or 211 from trimming circuit 300 altogether.

With momentary reference to FIGS. 2 and 3, although only two current sources 210 and 211 are illustrated, in other exemplary embodiments of the present invention, additional current sources may similarly be provided. In these exemplary embodiments, each current source is configured to have at least a first or a second temperature coefficient. In one exemplary embodiment of the present invention, current sources 210 and 211 are configured in parallel with each other and with the voltage reference or op amp device. However, current sources may also be configured in other series and parallel combinations which similarly achieve trimming of the voltage-reference or op amp.

Figure 4:
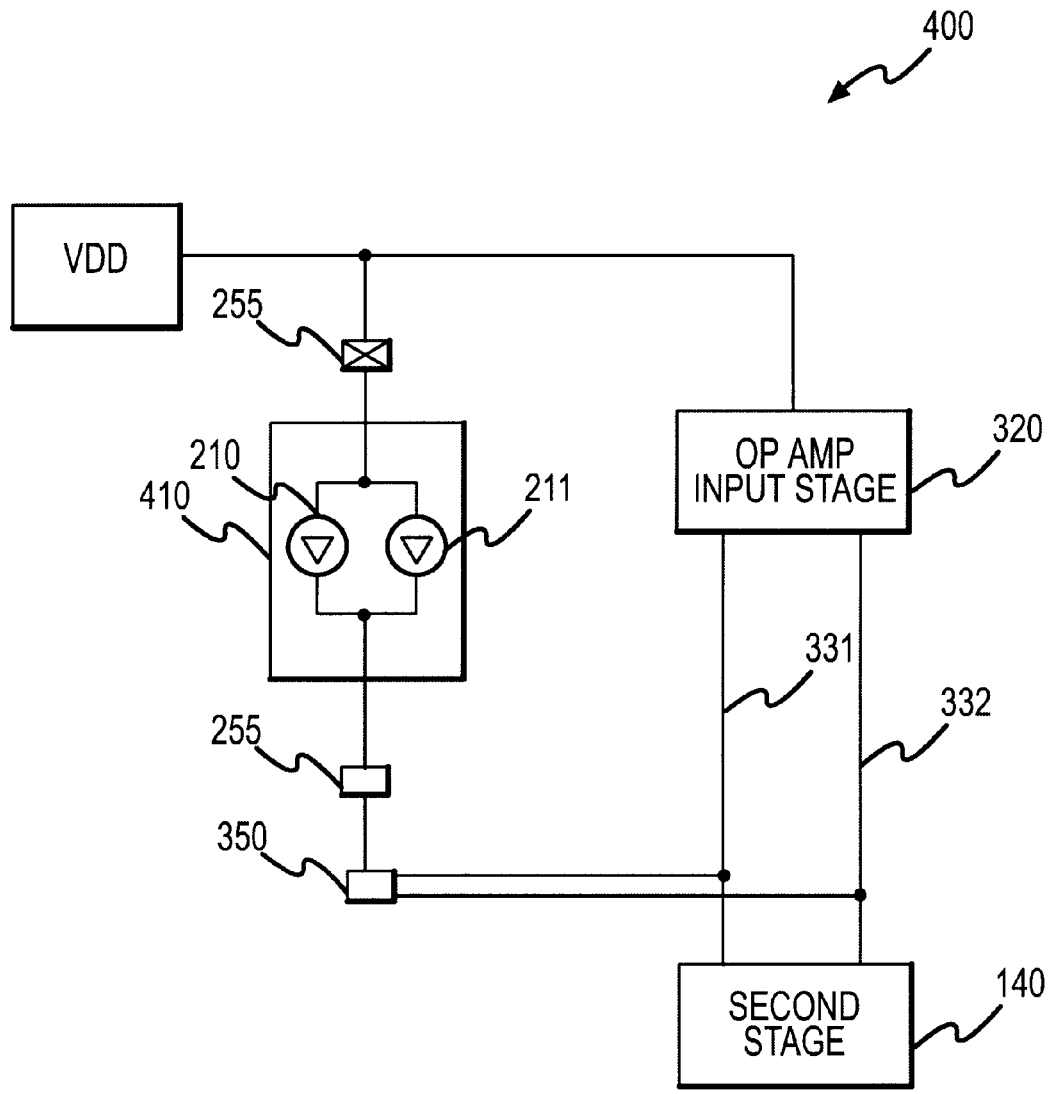

With reference to FIG. 4, and in accordance with another exemplary embodiment of the present invention, the two current sources 210 and 211 form a combination current source 410. As discussed above with reference to individual current sources, combination current source 410 can also be similarly configured to be selectively removed and added from trimming circuit 400, and/or selectively switched between first offset-control terminal 331 and second offset-control terminal 332. Furthermore, in accordance with this embodiment, the two current sources 210 and 211 can be similarly configured to be interchangeable with other current sources, not shown, to facilitate changing of the temperature coefficient of one of the two current sources of the combination current source for offset and drift trimming of trimming circuit 400. Although only one combination current source 410 is illustrated, in other exemplary embodiments of the present invention, additional combination current sources may similarly be provided in parallel with the op amp or voltage reference input stage.

Figure 5:
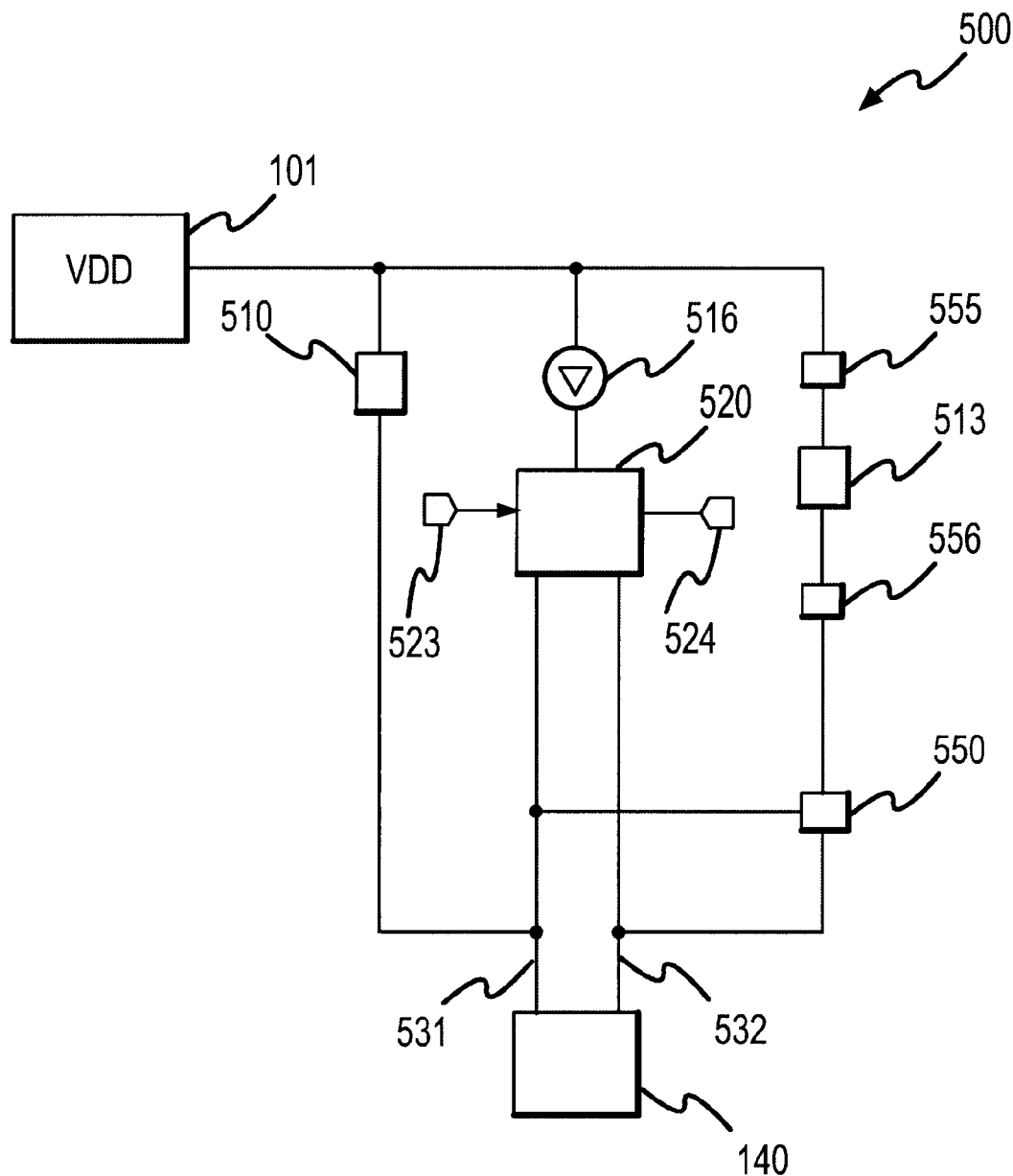

For example, with reference to FIG. 5, an exemplary trimming circuit 500 comprises a plurality of combination current sources, for example, two combination current sources 510 and 513, and an op amp input stage 520. Op-amp input stage 520 can comprise various components and devices in which trimming may be desired, such as a differential input/output stage. In accordance with this exemplary embodiment, op amp input stage 520 comprises a differential input/output stage having a pair of differential input terminals 523 and 524, and a pair of output terminals or offset-control terminals 531 and 532 which can be suitably coupled to a second stage 140. An additional current source 516 can be coupled between differential input stage 520 and power supply 101, where additional current source 516 is configured to provide current flow through differential input stage 520.

Although two combination current sources are illustrated, additional or fewer combination current sources may be used in accordance with various other exemplary embodiments. Combination current source 510 is configured between power source 101 and first offset-control terminal 531 of differential input stage 520, while combination current source 513 is configured between power source 101 and second offset-control terminal 532 of differential input stage 520. Combination current sources 510 and 513 are configured to facilitate trimming by changing the temperature coefficient of components within combination current sources 510 and 513. For example, in accordance with one exemplary embodiment, combination current sources 510 and 513 comprise current sources. In this exemplary embodiment, each of combination current sources 510 and 513 comprise at least two current sources, e.g., current sources 210 and 211, configured such that at least one current source has a positive temperature coefficient and another current source has a negative temperature coefficient. In accordance with this embodiment, the at least two current sources are configured to be interchangeable with other current sources to facilitate changing of the temperature coefficient of one of the at least two current sources of combination current sources 510 and 513.

In accordance with another exemplary embodiment, combination current sources 510 and 513 can comprise at least two transistor switches configured such that one transistor switch has a positive temperature coefficient and another transistor switch has a negative temperature coefficient. In accordance with this embodiment, the transistor switches can be configured to be interchangeable with other transistor switches to facilitate changing the temperature coefficient of one of the transistor switches.

In both the at least two current source embodiment and the at least two transistor switch embodiment for combination current sources 510 and 513, trimming of combination current sources 510 and 513 can be provided by changing the temperature dependencies of the components, e.g., the current sources or transistor switches, within combination current sources 510 and 513. Changing the temperature dependencies can balance the current provided by both the at least two current sources or the at least two transistor switches of combination current sources 510 and 513.

In accordance with another exemplary embodiment of the present invention, trimming circuit 500 is configured such that combination current sources 510 and 513 can be selectively connected to, or disconnected from, either of offset-control terminals 331 or 332 of differential input stage 520 to facilitate trimming of differential input stage 520. In accordance with this exemplary embodiment of the present invention, trimming circuit 500 can comprise switches coupled to one or more of combination current sources 510 and 513 to selectively connect them to, or disconnect them from, either of offset-control terminals 531 or 532. For example, switches 555 and 556 can enable combination current source 513 to be disconnected entirely, or selectively added or removed from, trimming circuit 500. Furthermore, using a switch device 550, combination current source 513 can be switched from second offset-control terminal 532 to first offset-control terminal 531, or vice versa. Additional switches, such as switches 550, 555 and 556 can be suitably configured with combination current source 510 and other additional combination current sources, if any. In this manner, trimming circuit 500 can enable differential input stage 520 be offset trimmed to provide accurate signals to second stage 140. Again, it is noted that second stage 140 may include one or more stages.

In an exemplary embodiment of the present invention, switching device 550 comprises a pair of switches; however, other known methods of disconnecting and connecting circuits may also be used. Furthermore, in an exemplary embodiment of the present invention, switches 555 and 556 comprise digital transmission switches for removing and adding combination current source 513 to trimming circuit 500; however, various other techniques may also be used. In accordance with another exemplary embodiment of the present invention, the trimming process can be accomplished by removing current sources from the circuit by cutting with a laser, using a digital switch, or blowing a fusible link. For example, in one embodiment, lasers can be used before packaging to cut electrical connections, while in another embodiment, fuses can be blown to break electrical connections. Further, EPROM devices can be used to either make or break electrical connections. In various exemplary embodiments of the present invention, the trimming process can occur after the circuit has been packaged.

Figure 6:
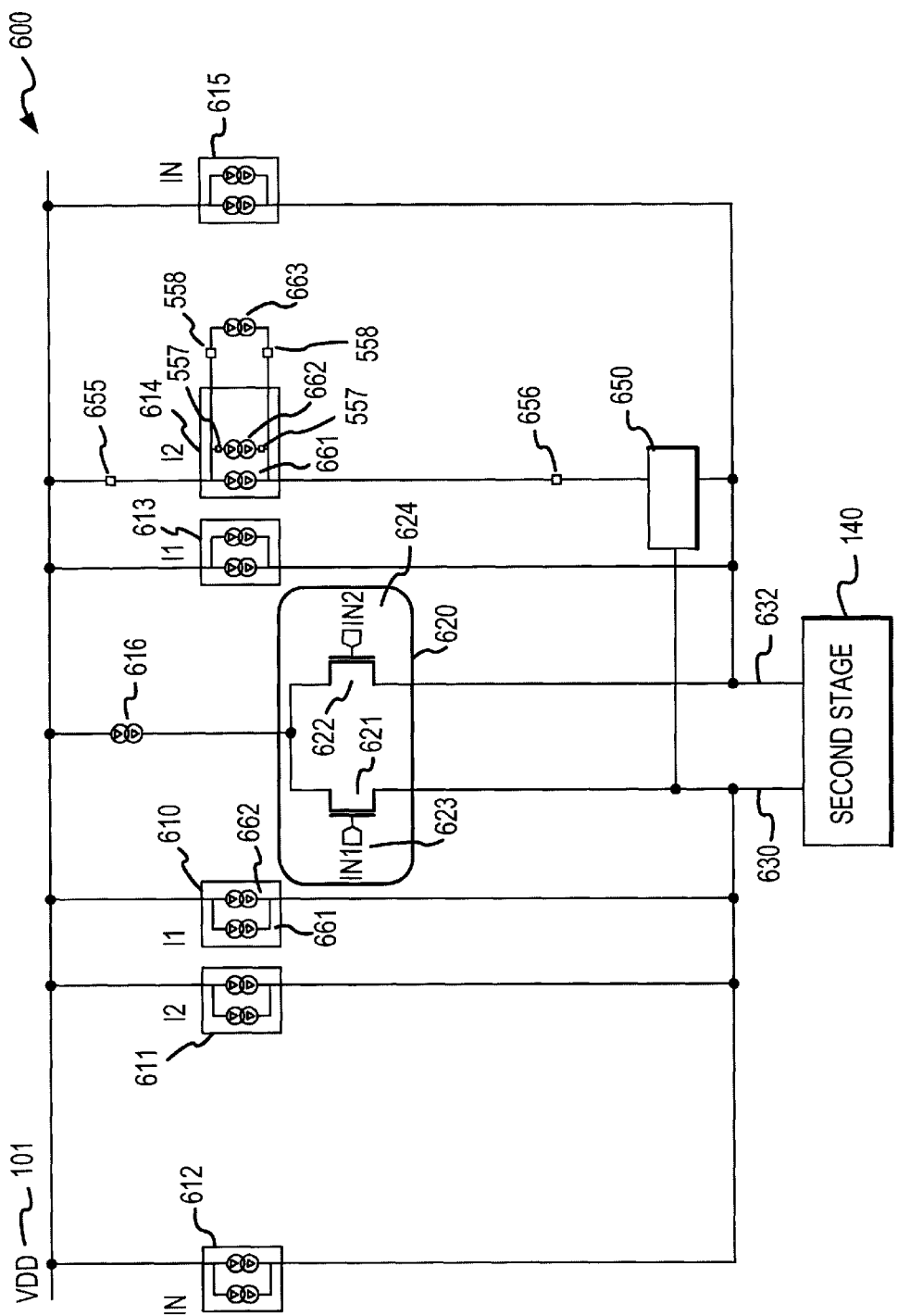
FIG. 6 illustrates a schematic diagram of an exemplary trimming circuit in accordance with an exemplary embodiment of the present invention.

In accordance with an exemplary embodiment of the present invention, with reference now to a schematic diagram of FIG. 6, a trimming circuit 600 comprises an op amp differential input stage 620, a voltage source 101, $V_{DD}$, and a current source stage. Differential input stage 620 comprises a differential pair of CMOS transistors 621 and 622 having gates configured to provide a pair of input terminals 623 and 624, e.g., IN1 and IN2, and drains configured to provide a first offset-control terminal 631 and a second offset-control terminal 632. Differential input stage 620 is configured to provide an output signal through first offset-control terminal 631 and second offset-control terminal 632 to a second stage 140.

Although an exemplary embodiment of differential input stage 620 is described with reference to a differential pair of CMOS transistors 621 and 622, differential input stage 620 may also comprise other op amp stages. For example, differential input stage 620 may comprise a band gap voltage reference, a resistive pressure sensor, a piezoelectric device, other sensors, both linear and non-linear, optics, and heat sensors such as thermocouples. Furthermore, although this exemplary embodiment describes a CMOS device being trimmed, it is understood that the present invention is similarly applicable to FET op amps and bipolar references, among other possible devices.

An exemplary current source stage comprises a plurality of combination current sources, represented as combination current sources 1 through N, for example current sources 610–612, coupled between power supply 101 and first offset-control terminal 631. In addition, another plurality of combination current sources, represented as combination current sources 1 through N, for example current sources 613–615, are coupled between power supply 101 and second offset-control terminal 632. While the illustrative embodiment provides for three combination current sources coupled to each of offset-control terminals 631 and 632, in accordance with other exemplary embodiments, additional or fewer combination current sources can be included, and the number of combination current sources attached to first offset-control terminal 631 can be different than the number of combination current sources attached to second offset-control terminal 632.

In an exemplary embodiment of the present invention, combination current sources 610–615 comprise at least two parallel current sources such that one current source has a positive temperature coefficient and another current source has a negative temperature coefficient. For example, combination current source 610 can comprise a first current source 661 having a positive temperature coefficient, i.e., a positive drift characteristic, and a second current source 662 having a negative temperature coefficient, i.e., a negative drift characteristic. In one exemplary embodiment of the present invention, combination current sources 610–615 may be configured to be trimmed through balancing of the currents of the first and second current sources 661 and 662. In other words, trimming causes the current from first current source 661 to be equal to the current from second current source 662.

In accordance with this embodiment, the first and second current sources 661 and 662 of combination current sources 610–615 are configured to be interchangeable with other current sources, e.g., a current source 663, for changing the temperature coefficient of one of first and second current sources 661 or 662. First and second current sources 661 and 662 are further configured such that trimming may be achieved by replacing, for example, second current source 662 with a current source 663 that has the same temperature coefficient as that of first current source 661. For example, in an exemplary embodiment, combination current source 614 is illustrated as having at least one current source configured to be removed from trimming circuit 600 by switches 557, and as having at least one current source configured to be connected in parallel with current source 661 via switches 558. Although illustrated only in the context of combination current source 614, any of current sources 610–615 may be configured to replace a first or second current source with a third current source, such as current source 663. Furthermore, various connecting and disconnecting devices may be used to connect and disconnect the current sources. In addition, third current source 663 may be configured to be connected within a specific combination current source, or may be configured to be selected from a group of third current sources for connection within one of various combination current sources.

In accordance with another exemplary embodiment of the present invention, one or more combination current sources 610–615 is selectively connected, such as through switches, to either of offset-control terminals 631 and 632 of differential input stage 620. For example, one or more of combination current sources 610–615 are configured to be selectively added or removed from communication with either offset-control terminal 631 or 632. One or more of combination current sources 610–612 can be configured through switches to selectively provide current to first offset-control terminal 631. In addition, one or more of combination current sources 610–612 can be selectively disconnected from first offset-control terminal 631 and connected to second offset-control terminal 632. Similarly, one or more of combination current sources. 613–615 can be selectively configured to provide current to second offset-control terminal 632, e.g., such as the connection of combination current source 614 through switches 655 and 656. Further, one or more of combination current sources 613–615 can be selectively disconnected from the second offset-control terminal 632 and connected to the first offset-control terminal 631, e.g., such as the connection of combination current source 614 through a switch 650. Accordingly, trimming circuit 600 is configured such that current can be selectively added and/or removed from offset-control terminals 631 and 632 and additional current can be transferred from one of offset-control terminals 631 and 632 to the other.

It should be noted that FIG. 6 shows, for reasons of simplicity, only combination current source 614 being configured with switching section 650 for changing the connected output between second offset-control terminal 632 and first offset-control terminal 631, as well as switches 655 and 656 configured to isolate combination current source 614 from trimming circuit 600. However, any of combination current sources 610–615 can include switches similar in function and structure to switches 650 and switches 655 and 656. Furthermore, other connection forming and breaking devices may also be used to connect and disconnect combination current sources to one of the offset-control terminals of differential input stage 620 for trimming the output of differential input stage 620.

In accordance with another exemplary embodiment, one or more of the current sources, for example current sources 661 and 662, can be configured as one or more master current sources. In addition, other current sources, for example current sources within combination current sources 611–615, can be configured such that the output current of dependent current sources within combination current sources 611–615 can be set in proportion to the output current of the master current source(s). Accordingly, trimming of a master combination current source may facilitate trimming of entire trimming circuit 600.

Figure 7:
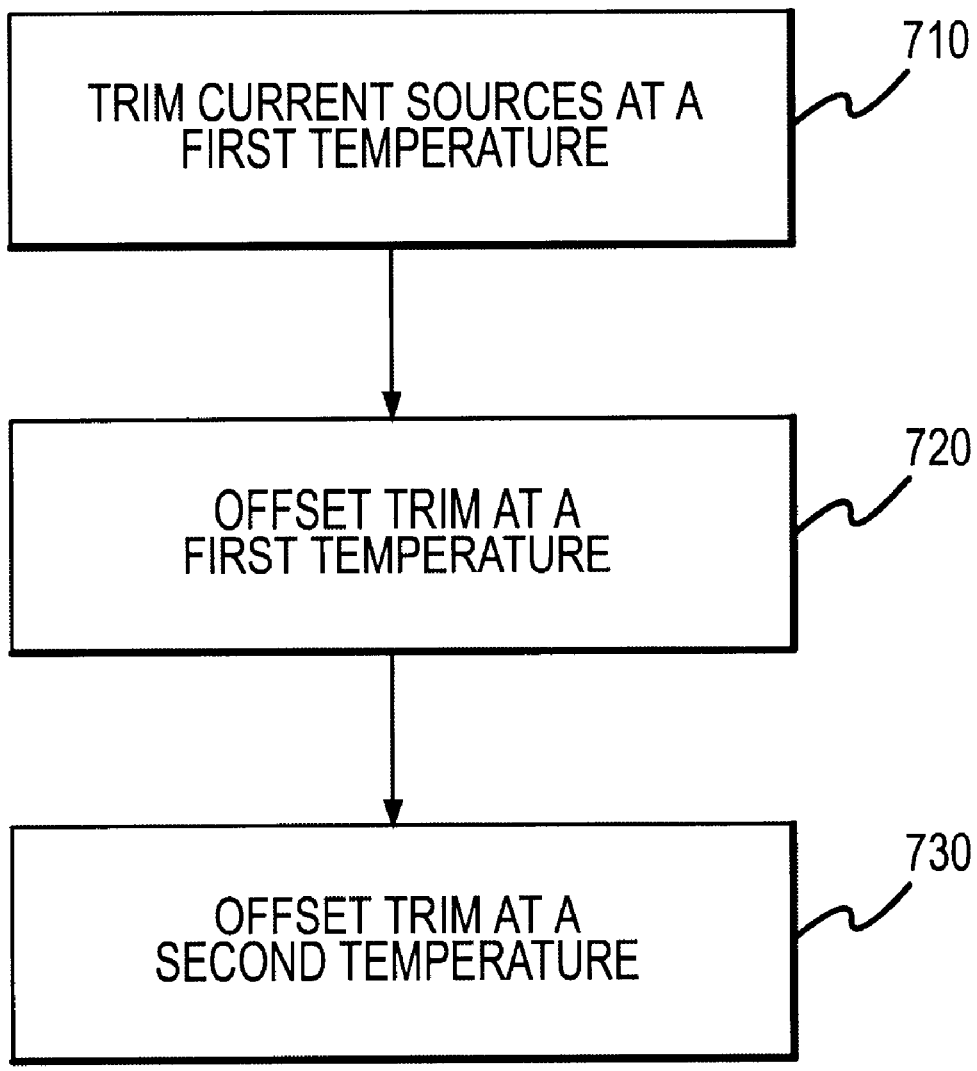
FIGS. 7–10 illustrate block diagrams of exemplary trimming methods in accordance with an exemplary embodiment of the present invention.

In accordance with another aspect of the present invention, a method of trimming is provided for trimming a device, such as an op amp or voltage reference device and the like, at least two different temperatures wherein the trimming method effectively decreases offset as well as temperature drift. With reference to FIG. 7, in accordance with an exemplary embodiment of the present invention, a block diagram of a trimming method 700 is illustarted. During an exemplary first step 710, and at a first temperature, pairs of current sources are trimmed within the combination current sources. The paired current sources comprise first and second current sources having first and second temperature dependencies. The trimming of the paired current sources balances currents between paired current sources within each combination current source. During an exemplary second step 720, and at the first temperature, the offset voltage is trimmed for the op amp device, e.g., a differential input stage. As part of an exemplary third step 730, the offset voltage of the differential input stage is again trimmed at a second temperature to account for temperature drift of the differential input stage.

Figure 8:
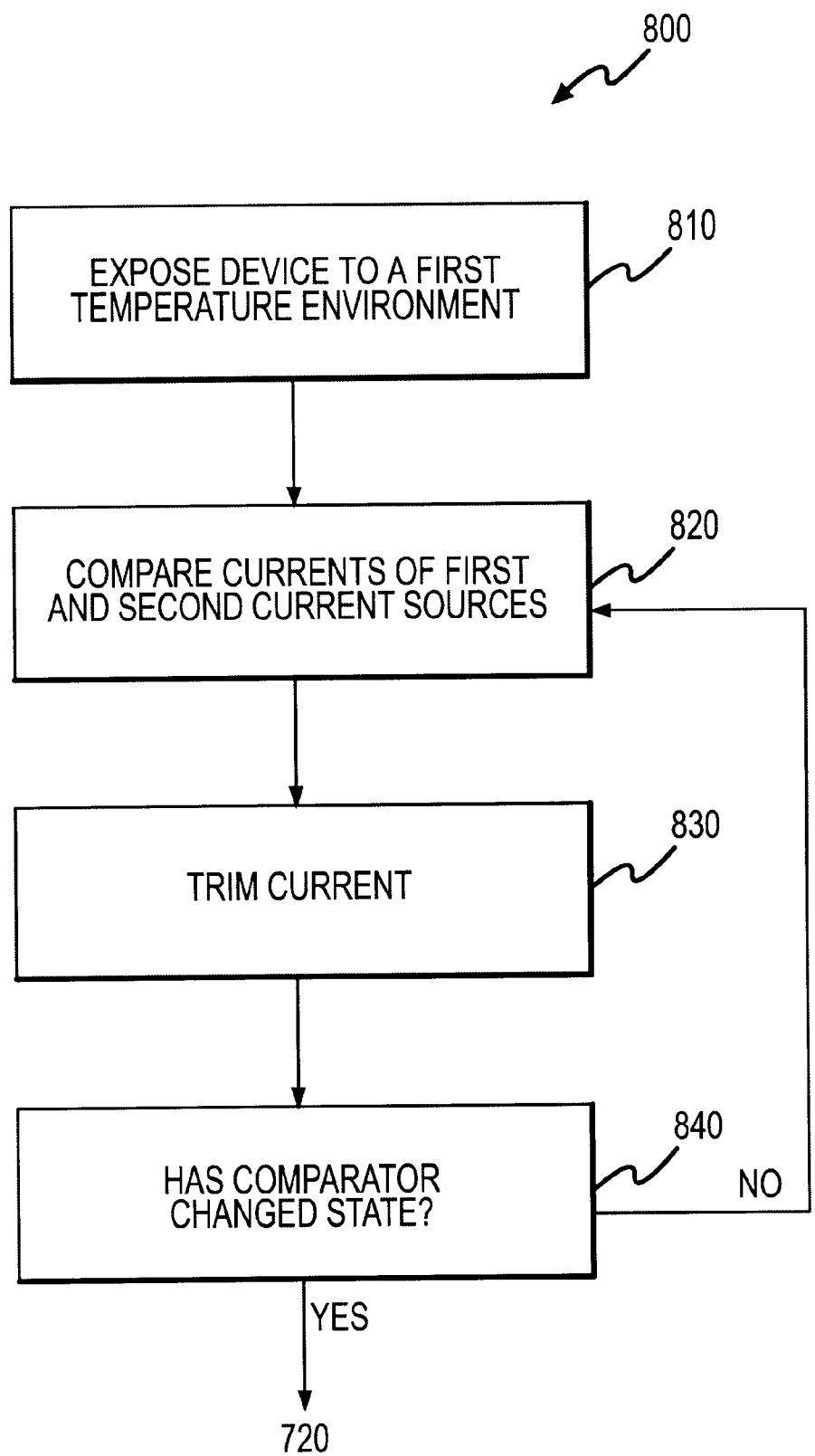

With simultaneous reference now to FIGS. 6, 7 and 8, step 710 suitably includes sub-steps 800 for trimming of a pair of current sources within a combination current source at a first temperature to balance the currents of the pair of current sources. For example, step 710 can comprise the trimming of a first and second current source, e.g., current sources 661 and 662, at a first temperature. As discussed above, the first and second current sources are configured to have first and second temperature dependencies. For example, first current source 661 can be configured to have a positive temperature coefficient and second current source 662 can be configured to have a negative temperature coefficient. In an exemplary embodiment, the current source trimming can be performed at a first temperature by causing the circuit to be in a controlled temperature environment in a step 810. This first temperature can be, for example, 25 degrees Celsius or room temperature; however, other values can be suitably chosen for the first temperature.

To facilitate trimming of current sources 661 and 662, the current from first current source 661 is compared to the current from second current source 662 using any one of a number of techniques for comparing currents. For example, step 820 can be implemented using a current comparator, e.g., a comparator with low-impedance inputs. In a step 830, the current may be trimmed step by step, e.g., bit by bit, until the comparator changes its state. In a step 840, the state of the comparator is determined; if the comparator state is not changed, first and second current sources 661 and 662 are again compared in step 820 and trimmed in step 830; when the state of the comparator is changed, the currents from two current sources 661 and 662 are then equal within the accuracy of the low-scale bit. Therefore, first trimming step 710 results in equal current flow from the first and second current sources of the combination current source.

In an exemplary embodiment of the present invention, a master combination current source can drive various numbers of other combination current sources. For example, a master combination current source can drive any or all of the combination current sources associated with the differential input stage of an op amp. In accordance with an exemplary embodiment, first and second current sources 661 and 662 can comprise a "master" combination current source 610. In this embodiment, the pairs of current sources in the other combination current sources 611–615 have their respective output values set in proportion to the master combination current sources. Therefore, the step 710 of trimming the first current source 661 and second current source 662 in master combination current source 610 also trims the paired current sources in each of the remaining combination current sources 611–615.

Furthermore, although the currents from each of the paired current sources is trimmed to be equal, in some embodiments, scaling causes different currents to flow from each combination current source. This difference in current between combination current sources provides a weighting of the effect of each combination current source in providing trimming of the offset of the differential input stage.

In accordance with an exemplary embodiment of the present invention, step 720 of trimming method 700 further employs sub-steps for trimming the offset of the op amp device, e.g., the differential input stage, at the first temperature. The offset trimming can be realized by switching combination current sources from one output of the differential input stage to the other output of the differential input stage. In another exemplary embodiment of the present invention, the offset trimming is performed by adding or removing combination current sources from a differential input stage output. In other words, offset trimming can be facilitated by changing the amount of current provided by the combination current sources to the offset-control terminals of the differential input stage.

Figure 9:
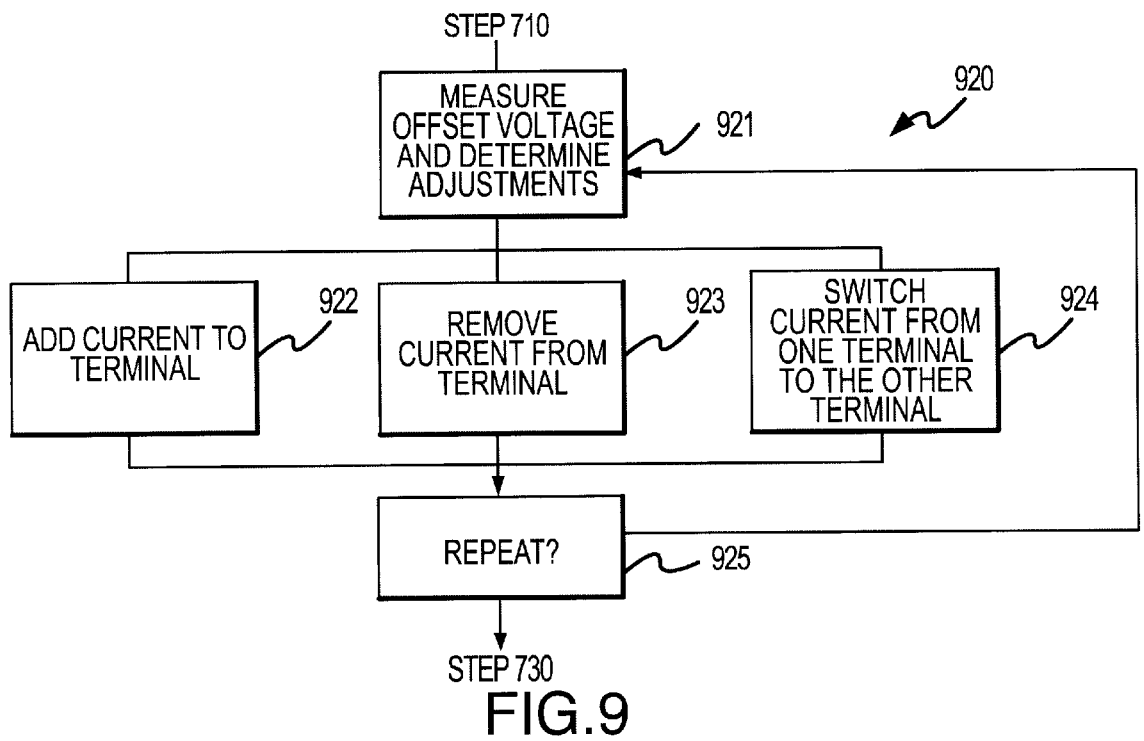

With additional reference to FIG. 9, in an exemplary embodiment of the present invention, exemplary sub-steps of step 720 are illustrated in steps 920. Although the first and second current sources are trimmed to have identical currents, an offset voltage may exist at the offset-control terminal(s). This offset voltage can be decreased by increasing or decreasing the total load current on one or more of the offset-control terminal(s). Thus, in a step 921, the offset-voltage is measured between, for example, first offset-control terminal 631 and second offset-control terminal 632. In step 921, trimming circuit 600 is further configured to process the measured offset voltage and determine adjustments that facilitate offset trimming. To provide offset trimming, current can be added in a step 922, and/or removed in a step 923, from offset-control terminals 631 and 632 causing the measured offset voltage to decrease.

In one exemplary embodiment, current is added in a step 922 to either first offset-control terminal 631 or second offset-control terminal 632 by connecting a previously unused combination current source to that offset-control terminal. Similarly, current can be removed in step 923 from offset-control terminal 631 and/or 632 by disconnecting a combination current source from offset-control terminal 631 and/or 632 and leaving that combination current source unused. The connecting and disconnecting can be facilitated through switches, e.g., switches 655 and 656. Also, current may be removed from one offset-control terminal and added to the other offset-control terminal by switching, for example in a step 924, the output of the combination current source from one offset-control terminal to the other using switching device 550. Furthermore, in an exemplary embodiment, step 920 comprises the further step 925 of determining whether the voltage offset has been sufficiently reduced, or whether to repeat the current adjusting process by starting again at step 921. The connecting, disconnecting, and switching of current sources can be achieved through several methods, including those methods described above.

First temperature offset trimming step 920 results in a circuit that is balanced at the first temperature. However, temperature drift may arise when the circuit is exposed to a second temperature which is higher or lower than the first temperature. To account for temperature drift, in accordance with an exemplary embodiment of the present invention, trimming method 700 further employs the step 730 of offset trimming the op amp device at a second temperature. The trimming of the op amp or voltage reference at the two temperatures decreases the offset and temperature drift that the op amp or voltage reference device might experience over a range of temperatures. Various methods can be used for supply current components that have a specified drift, positive or negative. For example, proportional-to-absolute-temperature techniques and $V_{BE}/R$ techniques can be utilized.

Figure 10:
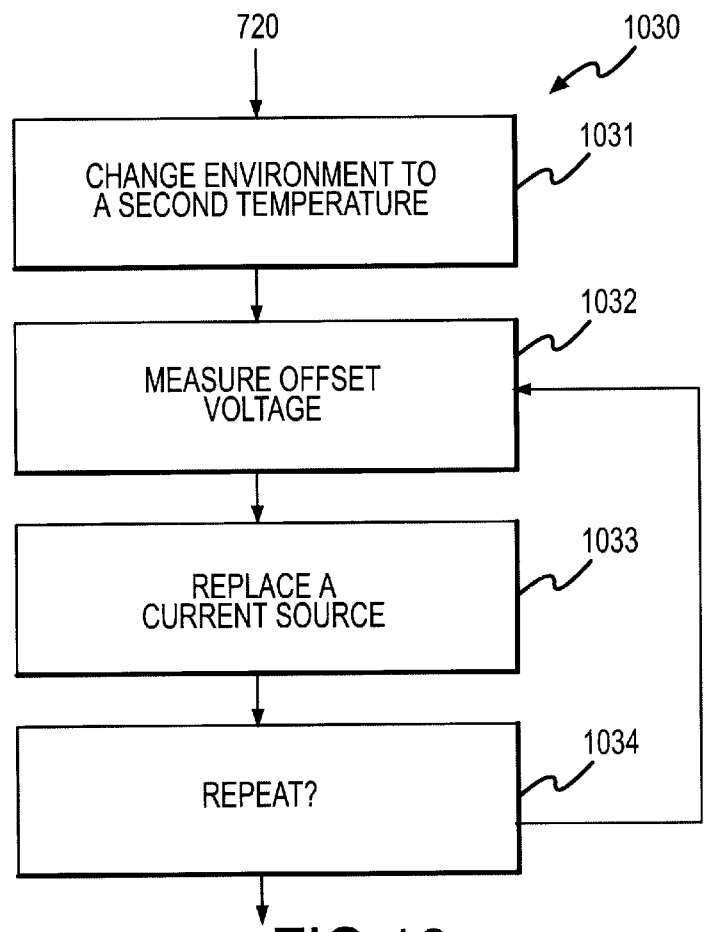

With reference now to FIG. 10, in an exemplary embodiment of the present invention, sub-steps of step 730 are illustrated in a step 1030. To facilitate offset trimming at a second temperature, the circuit environment temperature is changed to a second temperature in a step 1031. For example, the temperature can be changed to 85 degrees Celsius; however, other second temperatures can also be used. Further, although an exemplary embodiment of the present invention is described herein as trimming at two temperatures, trimming may also be performed on greater than two temperatures. The use of more than two temperatures facilitates trimming where temperature drift is a non-linear event, and can be provided by using piecewise linear approximation and other known methods for approximating non-linear functions.

Changing the temperature of the circuit might result in additional offset/drift, resulting in an increased offset voltage between first offset-control terminal 631 and second offset-control terminal 632. Thus, in accordance with an exemplary embodiment, the offset trimming at the second temperature can be accomplished by changing the temperature dependency of one of the two current sources within one or more combination current sources by replacing the first current source, having a first temperature coefficient, with a replica of the second current source, having a second temperature coefficient. In the exemplary embodiment, the first and second current sources are from the same combination current source.

Upon changing the environment of the trimming circuit to a second temperature, step 1031, the offset voltage is measured, in a step 1032. The trimming circuit is further configured to process the measured offset voltage and determine appropriate steps for trimming the op amp or voltage reference device. For example, during a step 1033, the trimming circuit may cause one or more current sources to be replaced such that the voltage offset is reduced.

During step 1030, the current source with the positive temperature coefficient increases current as temperature increases, e.g., when the second temperature is greater than the first temperature, while the current source with the negative temperature coefficient decreases current as temperature increases. Under these circumstances, a net increase in current of the combined source is obtained by replacing, in a step 1033, the negative temperature coefficient current source with a positive temperature coefficient current source that matches the positive temperature coefficient of the other current source. This operation does not change the current of the combined source on the first temperature, as currents of the positive and negative temperature coefficient are equal during the first temperature. However, this operation does increase the current of the combined source at the second temperature. Furthermore, in an exemplary embodiment, step 1030 comprises the further step of determining whether or not to repeat the offset voltage measurement and adjustment process by returning to step 1032.

Furthermore, if the second temperature is lower than the first temperature, the positive temperature coefficient current source decreases in current and the negative temperature coefficient current source increases in current. Thus, if less current is needed to trim the circuit, the positive temperature coefficient current source is replaced with a replica of the negative temperature coefficient current source. Therefore, replacing one of two current sources with a replica of the other, having temperature dependencies as described herein, can change the current to the offset-control terminal(s) and thus can decrease the offset voltage.

As an example, in accordance with an exemplary embodiment, one of first and second current sources 661 and 662 is configured with a positive temperature coefficient and the other is configured with a negative temperature coefficient. In this example, the original current levels for the first and second current sources 661 and 662 are both 10 micro Amperes after trimming in step 710. When measured again after the temperature increase, first current source 661 is found to have increased to 11 micro-Amperes and second current source 662 is found to have decreased to 9 micro-Amperes. Therefore, it is determined that first current source 661 has a positive temperature coefficient and second current source 662 has a negative temperature coefficient. Replacing second current source 662 with a third current source 663 of similar temperature coefficient to first current source 661, in a step 1033, increases the current from the combined current source. This step also causes both current sources to again supply the same current, in this example 11 micro-Amperes. This replacement has the net effect of increasing the total current at the outputs of differential input stage 220; however, trimming step 730 does not change the balance at the first temperature. Thus, by replacing one of the two current sources with a current source having the same temperature coefficient of the other current source, differential input stage 620 can be trimmed at the second temperature.

In a further exemplary embodiment, various steps of trimming method 700 may be performed through an automated process. For example, during second temperature trimming in step 730, one of the two current sources within a combined source can be replaced, and the effect on offset-control terminals 631 and 632 of the differential input stage 620 can be observed. If the result improves the trimming of differential input stage 620, the switch condition of the current source can be programmed into Read Only Memory (ROM), or can be similarly identified or fixed. If the result does not improve the trimming, the opposite current source switching is performed such that the other current source is replaced. This process can be repeated for multiple current sources. Furthermore, in an exemplary embodiment of the present invention, the current sources may be weighted such that voltage offsets of various magnitudes may be addressed by replacing one or more current sources.

Although trimming method 700 illustrates one exemplary method for trimming a circuit on two temperatures, other methods may also perform two temperature trimming with similar temperature coefficient current source switching. In an exemplary embodiment of the present invention, a first current source, having a first temperature coefficient and a second current source, having a second temperature coefficient, are trimmed at a first temperature such that current from the first current source equals current from the second current source. In this embodiment, the first and second current sources are configured such that at least some of the first and second current sources may be individually connected to, or disconnected from, an offset-control terminal 230 or 231 of differential input stage 220 and some may be switched from one terminal to the other. Next, op amp or voltage reference offset can then be trimmed at the first temperature by selectively switching one or more first current sources between offset-control terminals, adding the first current sources to an offset-control terminal, or removing the first current sources from an offset-control terminal. Finally, second temperature trimming is performed by replacing some first current sources with replicas of second current sources. The replacing of first current sources having first temperature coefficients with other current sources having temperature coefficients, which are similar to the second current sources, facilitates trimming of the trimming circuit on two temperatures.

The above techniques and circuits, which generally include two or more current sources, can be effective in trimming for offset as well as temperature drift. However, in accordance with another aspect of the present invention, an exemplary trimming circuit can be further simplified to include a single current source to provide for trimming of offset and temperature drift in a device, such as an op amp, voltage reference and the like. In accordance with this aspect of the present invention, a temperature-dependent current source is trimmed to a predetermined value at a first temperature, and then the current from the temperature-dependent current source is used to trim output parameters, i.e., adjust the output variables, to a desired value at a second temperature.

Figure 11:
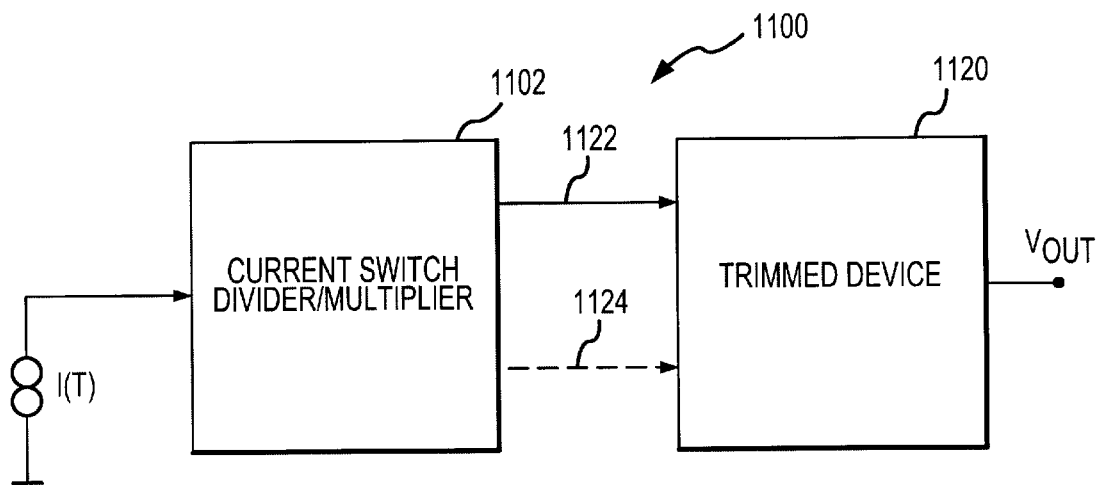
FIG. 11 illustrates a block diagram of an exemplary circuit for trimming a device for compensation of temperature drift in accordance with an exemplary embodiment of the present invention.

For example, with reference to FIG. 11, an exemplary trimming circuit 1100 comprises a temperature-dependent current source $I_{(T)}$, a current switch 1102 and a device 1120 to be trimmed, such as an op amp, voltage reference and the like. Temperature-dependent current source $I_{(T)}$ comprises any temperature-dependent current source device, including those described above, and can be suitably trimmed to various values, including zero. Temperature-dependent current source $I_{(T)}$ is suitably coupled to trimmed device 1120 through current switch 1102.

Current switch 1102 is configured to suitably facilitate the trimming of trimmed device 1120 through coupling of current signal from temperature-dependent current source $I_{(T)}$ to one or more offset-control terminals of trimmed device 1120, such as offset-control terminals 1122 and/or 1124. Current switch 1102 can comprise various types of switching components and devices, such as those described above, for providing the current from temperature-dependent current source $I_{(T)}$.

In accordance with an exemplary embodiment, current switch 1102 can be configured as a current divider to provide a fraction of the current from temperature-dependent current source $I_{(T)}$ to offset-control terminals 1122 and/or 1124 during trimming at a second temperature. Thus, depending on the amount of current needed for trimming of trimmed device 1120, current switch 1102 can provide only a fraction of the amount of current available from temperature-dependent current source $I_{(T)}$. In accordance with this exemplary embodiment, current switch 1102 can comprise any circuit or device for dividing the current from temperature-dependent current source $I_{(T)}$ and providing the divided current to trimmed device 1120.

In accordance with another exemplary embodiment, current switch 1102 can be configured to provide a multiple of the current from temperature-dependent current source $I_{(T)}$ to offset-control terminals 1122 and/or 1124 during trimming at a second temperature. Thus, in the event that the current needed for trimming of trimmed device 1120 is greater than the current available from temperature-dependent current source $I_{(T)}$, current switch 1102-can suitably amplify or increase the current to a multiple of the current provided from temperature-dependent current source $I_{(T)}$. In accordance with this embodiment, current switch can comprise any circuit or device for amplifying the current from temperature-dependent current source $I_{(T)}$ and providing the divided current to trimmed device 1120. This current multiplying function can be configured instead of the dividing function of current switch 1102, in addition to the dividing function, or conjunction with the dividing function of current switch 1102.

Current switch 1102 can be configured with one or more offset-control terminals 1122 and/or 1124 to provide a divider or multiple of current signal from temperature-dependent current source $I_{(T)}$ to trimmed device 1120. Offset-control terminals 1122 and/or 1124 comprise control inputs configured to provide an interface to trimmed device 1120. Any number of offset-control terminals 1122 and/or 1124 can be included to provide current signal to trimmed device 1120. For example, current switch 1102 can be configured as a sign switch for a single-offset terminal for a device under test (DUT) like trimmed device 1120. Current switch can also be configured to switch between offset-control terminals 1122 and 1124, or any other additional offset-control terminals.

Figure 13:
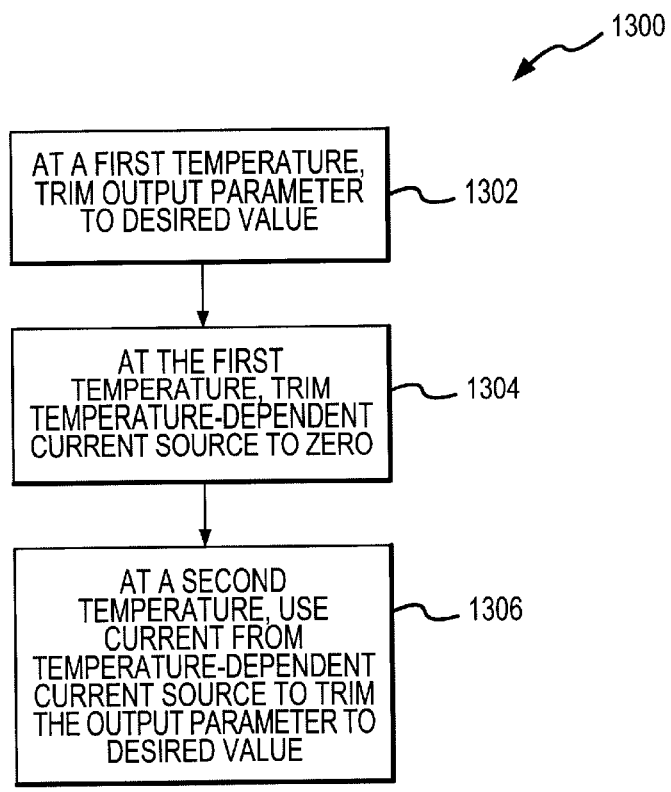
FIG. 13 illustrates an exemplary trimming method in accordance with an exemplary embodiment of the present invention.

To further illustrate operation of trimming circuit 1100, with additional reference to FIG. 13, an exemplary method for trimming 1300 is illustrated. In a step 1302, at a first temperature, the output parameter of trimmed device 1120, e.g., the voltage at output terminal $V_{OUT}$, is trimmed to a desired value. The trimming of the output parameter can be conducted by using independent current or voltage sources, changing the sizes of the devices within trimmed device 1120, changing the bias current, or any other method for trimming the output parameter to a desired value. The first temperature can comprise various values, for example, in an exemplary embodiment at approximately 125 degrees Celsius, various other values greater than or less than approximately 125 degrees Celsius. In a step 1304, again at the first temperature, temperature-dependent current source $I_{(T)}$ is suitably trimmed to a predetermine value, for example, to approximately zero. Although step 1304 is illustrated as occurring after step 1302, step 1304 can also occur simultaneously with, or prior to, step 1302. Thereafter, in a step 1306, at a second temperature, for example at approximately 20 degrees Celsius, the current from temperature-dependent current source $I_{(T)}$ is used to trim the output parameter of the trimmed device 1120, e.g., voltage at output terminal $V_{OUT}$, to a desired value. This current can comprise the entire amount of current from temperature-dependent current source $I_{(T)}$, a fraction of the current, or a multiple of the current as needed for trimming of device 1120, as controlled by current switch 1102. As a result, the offset and temperature drift of device 1120 can be suitably reduced, while further simplifying the trimming circuit. Further, due to the simpler implementation, less noise can be introduced in the controlled device.

Figure 12:
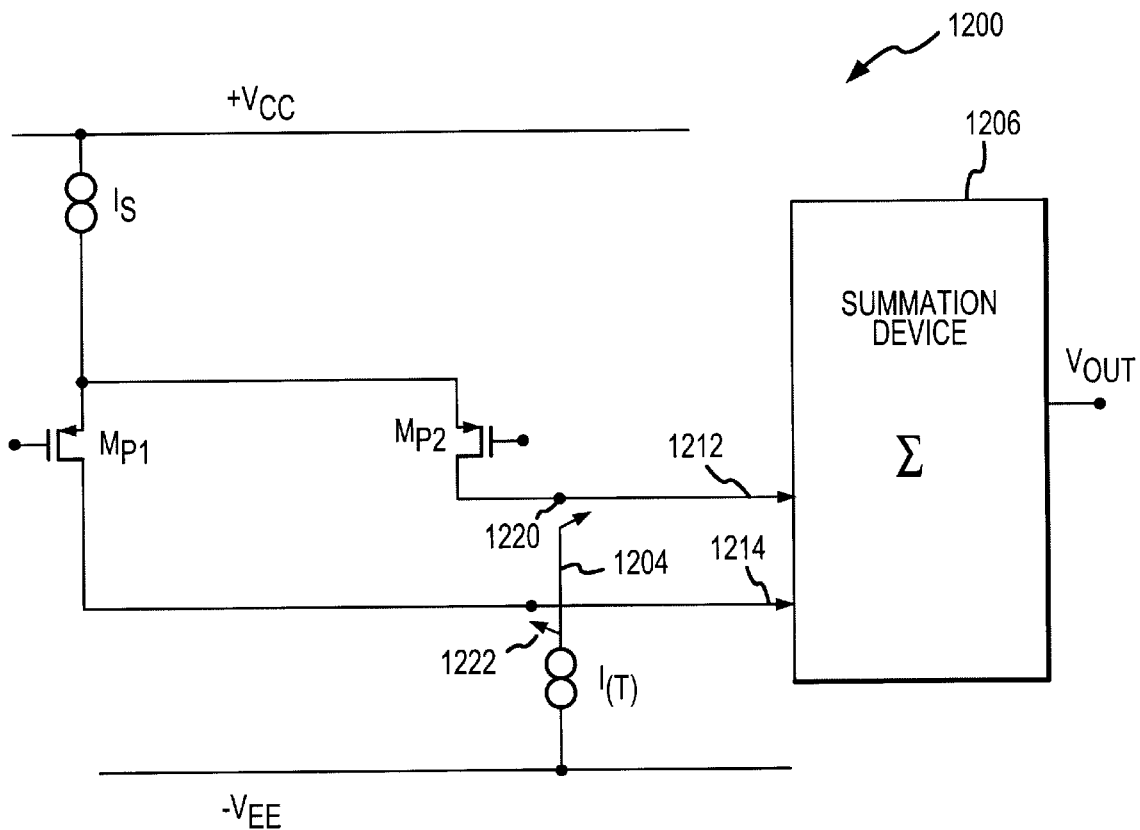
FIG. 12 illustrates a schematic diagram of an exemplary trimming circuit in accordance with another exemplary embodiment of the present invention.

With reference to FIG. 12, an exemplary an exemplary trimming circuit can be configured within a rail-to-rail amplifier circuit 1200. In accordance with an exemplary embodiment, amplifier circuit 1200 comprises a PMOS input stage comprising a differential pair of transistors $M_{P1}$ and $M_{P2}$, a current switch circuit 1204, and a summation device 1206. The PMOS input stage is configured with a stable-current source $I_S$ for supply current. A positive supply bus $V_{cc}+$ is coupled to the PMOS input stage through stable-current source $I_S$. Although a PMOS input stage is illustrated, amplifier circuit 1200 could be suitably configured with a single NMOS stage.

The PMOS input stage is coupled through the drains of transistors $M_{P1}$ and $M_{P2}$ to summation device 1206. Summation device 1206 is configured to sum current signals from one or more control input terminals 1212 and 1214, and to provide a signal output $V_{OUT}$. In the exemplary embodiments, control input terminals 1212 and 1214 are coupled to the drain terminals of transistors $M_{P2}$ and $M_{P1}$, respectively.

To facilitate trimming of the PMOS input stages, the current switch circuit 1204 comprises switches 1220 and 1222. A temperature-dependent current source $I_{(T)}$ is configured with current switch circuit 1204 and is coupled to the PMOS input stage. Current switch circuits 1204 is suitably coupled to the drains of transistors $M_{P1}$ and $M_{P2}$ of the PMOS input stage. Current switch circuits 1204 is configured to provide a divider and/or multiple of the current signal from temperature-dependent current source $I_{(T)}$ through switches 1420 and 1422.

During operation, the PMOS input stage may include significant input offsets. At a first temperature, e.g., approximately 125 degrees Celsius, the output parameters of the PMOS input stage are trimmed to desired values. Next, again at the first temperature, temperature-dependent current source $I_{(T)}$ is suitably trimmed to zero. Thereafter, at a second temperature, e.g., approximately 20 degrees Celsius, switch circuit 1204 is configured to couple the current signal from temperature-dependent current source $I_{(T)}$ to trim the output parameters of the PMOS input stage to a desired value, such as approximately zero, i.e., temperature-dependent current source $I_{2(T)}$ is configured to trim the output parameter of the PMOS input stage. The current signals coupled by switch circuit 1204 can comprise the entire amount of current from temperature-dependent current source $I_{(T)}$, a fraction of the current, or a multiple of the current. As a result, the offset and temperature drift of amplifier circuit 1200 can be suitably reduced, while further simplifying the trimming circuit.

Figure 14:
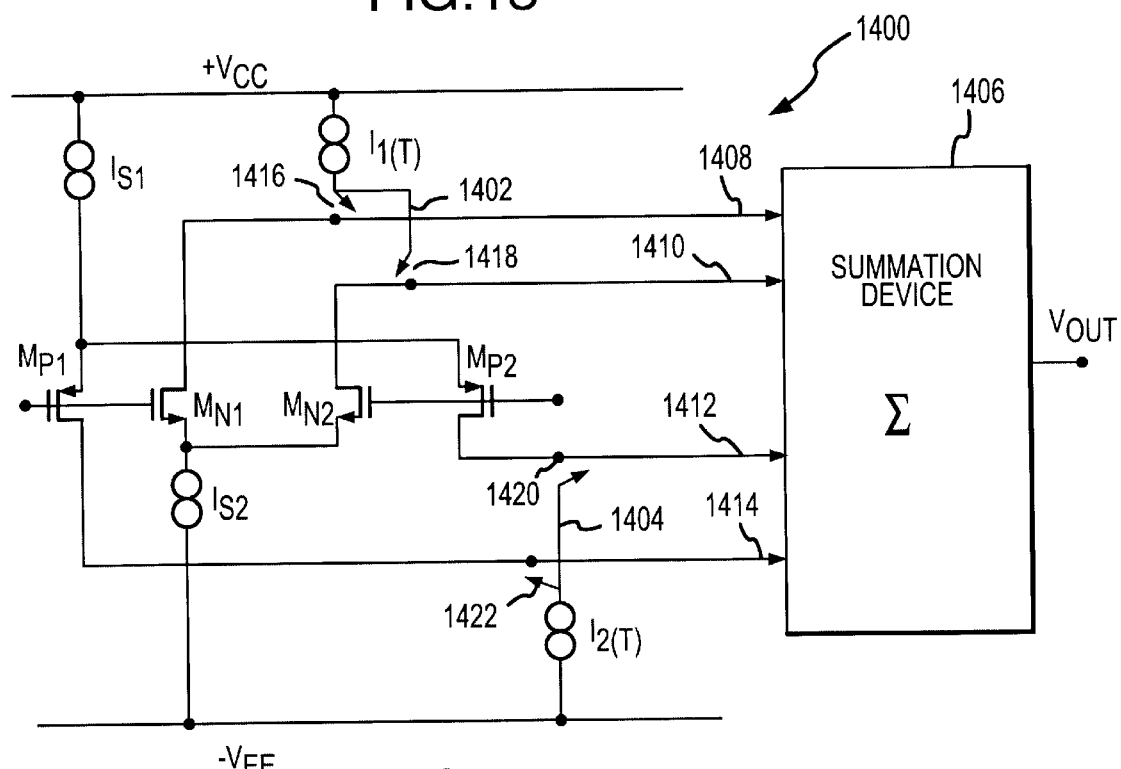
FIG. 14 illustrates a schematic diagram of another exemplary trimming circuit in accordance with another exemplary embodiment of the present invention.

The trimming circuit and process illustrated in circuit 1100 can be further extended to facilitate trimming of not only a single output parameter, but also two or more output parameters. For example, with reference to FIG. 14, an exemplary trimming circuit can be configured within a rail-to-rail amplifier circuit 1400. Amplifier circuit 1400 comprises complimentary input stages, namely, a PMOS input stage comprising transistors $M_{P1}$ and $M_{P2}$, and an NMOS input stage comprising transistors $M_{N1}$ and $M_{N2}$, a current switch circuit, and a summation device 1406. The PMOS input stage is configured with a stable-current source $I_{S1}$ for supply current, while the NMOS input stage is configured with a stable-current source $I_{S2}$ for supply current. A positive supply bus $V_{cc}+$ is coupled to the PMOS input stage through stable-current source $I_{S2}$, while a negative supply bus $V_{EE}-$ is coupled to the NMOS input stage through stable-current source $I_{S1}$.

Both the PMOS input stage and NMOS input stage are coupled through the drains of their respective transistors $M_{P1}$ and $M_{P2}$, and transistors $M_{N1}$ and $M_{N2}$, to summation device 1406. Summation device 1406 is configured to sum current signals from one or more control input terminals 1408, 1410, 1412 and 1414, and to provide a signal output $V_{OUT}$. In the exemplary embodiments, control input terminals 1408, 1410, 1412 and 1414 are coupled to the drain terminals of transistors $M_{N1}$ and $M_{N2}$, and transistors $M_{P2}$ and $M_{P1}$, respectively.

To facilitate trimming of the NMOS and PMOS input stages, the current switch circuit comprises a current switch circuit 1402 and a current switch circuit 1404. A first temperature-dependent current source $I_{1(T)}$ is configured with current switch circuit 1402 and is coupled to the NMOS input stage, and a second temperature-dependent current source $I_{2(T)}$ is configured with current switch circuit 1404 and is coupled to the PMOS input stage. Current switch circuits 1402 and 1404 are suitably coupled to the drains of the NMOS input stage and the PMOS input stage, respectively. Current switch circuits 1402 and 1404 are configured to provide a divider and/or multiple of the current signal from first temperature-dependent current source $I_{1(T)}$ and second temperature-dependent current source $I_{2(T)}$ through switches 1416 and 1418 and switches 1420 and 1422, respectively.

During operation, the PMOS and NMOS input stages may include significant input offsets. At a first temperature, e.g., approximately 125 degrees Celsius, the output parameters of the PMOS and/or NMOS input stages are trimmed to desired values. Next, again at the first temperature, one or both of temperature-dependent current source $I_{1(T)}$ and $I_{2(T)}$ are suitably trimmed to zero. Thereafter, at a second temperature, e.g., approximately 20 degrees Celsius, switch circuits 1402 and/or 1404 are configured to couple the current signals from temperature-dependent current sources $I_{1(T)}$ and/or $I_{2(T)}$ to trim the output parameters of the PMOS and/or NMOS input stages to a desired value, i.e., temperature-dependent current source $I_{2(T)}$ is configured to trim the output parameter of the PMOS input stage, and temperature-dependent current source $I_{1(T)}$ is configured to trim the output parameter of the NMOS input stage. The current signals coupled by switch circuits 1402 and/or 1404 can comprise the entire amount of current from temperature-dependent current sources $I_{1(T)}$ and/or $I_{2(T)}$, a fraction of the current, or a multiple of the current. As a result, the offset and temperature drift of amplifier circuit 1400 can be suitably reduced, while further simplifying the trimming circuit.

The present invention has been described above with reference to exemplary embodiments. However, those skilled in the art will recognize that changes and modification may be made to the exemplary embodiment without departing from the scope of the present invention, For example, the various components may be implemented in alternate ways, such as varying of alternating the steps in different orders. These alternatives can be suitably selected depending upon the particular application or in consideration of any number of factors associated with the operation of the system. For example, although various embodiment are described in terms of trimming to reduce offset of differences in current, it will be appreciated that the devices and methods described herein may also be useful for achieving set offsets or differences in current, and that various trimming goals may be achieved through a combination of efforts to reduce offsets and to achieve specified offsets and differences. These and other changes or modifications are intended to be included within the scope of the present invention.

What is claimed is:

1. A trimming circuit for facilitating trimming of offset and temperature drift in a device, said trimming circuit comprising:

a temperature-dependent current source configured for providing a current signal;

a current switch circuit coupled between said temperature-dependent current source and the device, said current switch circuit coupled to at least one control input terminal of the device; and wherein at a first temperature said trimming circuit is configured to trim an output parameter of the device to a desired value and the temperature-dependent current source to a first value, and at a second temperature said current switch circuit is configured to provide said current signal from said temperature-dependent current source to trim the output parameter of the device.

2. The trimming circuit according to claim 1, wherein said current switch circuit is configured to couple a fraction of said current signal from said temperature-dependent current source to trim the output parameter of the device.

3. The trimming circuit according to claim 1, wherein said current switch circuit is configured to couple a multiple of said current signal from said temperature-dependent current source to trim the output parameter of the device.

4. The trimming circuit according to claim 1, wherein said current switch circuit is coupled to at least two control input terminals of the device.

5. The trimming circuit according to claim 1, wherein said temperature-dependent current source is configured for providing a current signal to a PMOS input stage to facilitate trimming of the output parameter of the device.

6. The trimming circuit according to claim 1, wherein said trimming circuit comprises a first temperature-dependent current source configured for providing a first current signal and a second temperature-dependent current source configured for providing a second current signal, and wherein said current switch circuit comprises a first current switch circuit for coupling said first temperature-dependent current source to a first device during trimming of the output parameter of the first device, and a second current switch circuit for coupling said second temperature-dependent current source to a second device during trimming of the output parameter of the second device.

7. A amplifier circuit configured for reduced offset and temperature drift, said amplifier circuit comprising:
- a temperature-dependent current source configured for providing a current signal, said temperature-dependent current source configured to be trimmed to a first value at a first temperature;
- a device comprising at least one control input terminal and a control output terminal, said device having an output parameter configured at said control output terminal, said output parameter configured to be trimmed to a desired value at the first temperature; and
- a current switch circuit coupled between said temperature-dependent current source and said at least one control input terminal of said device, said current switch circuit configured to provide said current signal from said temperature-dependent current source to trim said output parameter of said device at a second temperature.

8. The amplifier circuit according to claim 7, wherein said current switch circuit is configured to couple a fraction of said current signal from said temperature-dependent current source to trim said output parameter of said device.

9. The trimming circuit according to claim 7, wherein said current switch circuit is configured to couple a multiple of said current signal from said temperature-dependent current source to trim said output parameter of said device.

10. The trimming circuit according to claim 7, wherein said current switch circuit is coupled to at least two control input terminals of said device.

11. The trimming circuit according to claim 7, wherein said device comprises one of an op amp, voltage reference, instrumentation amplifier and a DAC.

12. The trimming circuit according to claim 7, wherein said amplifier circuit comprises:
- a PMOS input stage, configured within said device, said PMOS input stage comprising a first output terminal having a first output parameter;
- a first temperature-dependent current source configured for providing a first current signal; and
- wherein said current switch circuit comprises a first current switch circuit configured for coupling said first temperature-dependent current source to said first output terminal of said PMOS input stage during trimming at the second temperature of said output parameter of said PMOS input stage.

13. The trimming circuit according to claim 12, wherein said amplifier circuit further comprises:
- an NMOS input stage configured within said device, said NMOS input stage comprising a second output terminal having a second output parameter;
- a second temperature-dependent current source configured for providing a second current signal; and
- wherein said current switch circuit comprises a second current switch circuit configured for coupling said second temperature-dependent current source to said NMOS input stage during trimming at the second temperature of said output parameter of said NMOS input stage.

14. The amplifier circuit according to claim 13, wherein said amplifier circuit further comprises a summation circuit configured for summation of signals from said first output terminal and said second output terminal.

15. The amplifier circuit according to claim 13, wherein said first switch circuit is coupled between said first temperature-dependent current source and a pair of output terminals of said PMOS input stage, and said first switch circuit is coupled between said first temperature-dependent current source and a pair of output terminals of said PMOS input stage.

16. A method for trimming offset and temperature drift in an electrical device, said method comprising the steps of:
- trimming at a first temperature an output parameter of the electrical device to a desired value;
- trimming at the first temperature a temperature-dependent current source to a first value; and
- providing current signal from said temperature-dependent current source to facilitate trimming at a second temperature the output parameter of the electrical device to the desired value.

17. The method for trimming according to claim 16, wherein said step of providing current signal comprises coupling said current signal through a current switch circuit to at least one control input terminal of the electrical device.

18. The method for trimming according to claim 17, wherein said step of providing current signal comprises coupling a fraction of said current signal through said current switch circuit.

19. The method for trimming according to claim 17, wherein said step of providing current signal comprises coupling a multiple of said current signal through said current switch circuit.

20. The method for trimming according to claim 16, wherein said step of providing current signal comprises coupling said current signal through a current switch circuit to drain terminals of at least one of a PMOS input stage and an NMOS input stage.

* * * * *